(12) United States Patent
Yoo et al.

(10) Patent No.: US 8,178,951 B2
(45) Date of Patent: May 15, 2012

(54) COMPOUND SEMICONDUCTOR SUBSTRATE AND CONTROL FOR ELECTRICAL PROPERTY THEREOF

(75) Inventors: Young Zo Yoo, Gyeonggi-do (KR); Hyun Min Shin, Gyeonggi-do (KR); Jun Sung Choi, Gyeonggi-do (KR)

(73) Assignee: Samsung Corning Precision Materials Co., Ltd., Gyeongsangbuk-do (KR)

( * ) Notice: Subject to any disclaimer, the term of this patent is extended or adjusted under 35 U.S.C. 154(b) by 301 days.

(21) Appl. No.: 12/442,156

(22) PCT Filed: Nov. 15, 2007

(86) PCT No.: PCT/KR2007/005730
§ 371 (c)(1),
(2), (4) Date: Mar. 20, 2009

(87) PCT Pub. No.: WO2008/062968
PCT Pub. Date: May 29, 2008

(65) Prior Publication Data
US 2009/0230513 A1    Sep. 17, 2009

(30) Foreign Application Priority Data

Nov. 21, 2006 (KR) .................. 10-2006-0115115
Nov. 14, 2007 (KR) .................. 10-2007-0115882

(51) Int. Cl.
*H01L 23/58* (2006.01)
*H01L 29/20* (2006.01)
(52) U.S. Cl. ............... 257/631; 257/615; 257/E21.125; 257/E21.032; 257/E21.043; 438/445; 438/515; 438/471
(58) Field of Classification Search ........... 257/E21.125, 257/E21.032, E21.043, 615, 631; 438/445, 438/515, 471; H01L 129/36, 21/265
See application file for complete search history.

(56) References Cited

U.S. PATENT DOCUMENTS 5,145,794 A * 9/1992 Kase et al. .................... 438/515
(Continued)

FOREIGN PATENT DOCUMENTS

KR    1019940016454    7/1994
(Continued)

OTHER PUBLICATIONS

Knights et al. Comparison of the annealing characteristics of resistivity and vacancy defects for implant isolated n-type GaAs. Journal of Applied Physics, vol. 87, # 2, 2000, pp. 663-667.*

(Continued)

*Primary Examiner* — Colleen A Matthews
*Assistant Examiner* — Galina Yushina
(74) *Attorney, Agent, or Firm* — Lerner, David, Littenberg, Krumholz & Mentlik, LLP

(57) ABSTRACT

There is provided a compound semiconductor substrate prepared by forming a point defect in an inside structure thereof by implanting an electrically-neutral impurity with energy of 0.1 to 10 MeV on a surface of the substrate. When the compound semiconductor is undoped, electrical resistance increases to increase insulating properties, and when the compound semiconductor is doped with an n-type dopant, the impurity is implanted and charge concentration of the substrate increases to increase conductive properties. In accordance with the present invention, the various electrical properties needed for the compound semiconductor can be effectively controlled by increasing the insulating properties of the undoped compound semiconductor or by increasing the charge concentration of the n-type compound semiconductor, and the application range to various devices can be expanded.

14 Claims, 2 Drawing Sheets

U.S. PATENT DOCUMENTS 5,182,218 A     1/1993    Fujihira
5,376,822 A    12/1994    Taguchi
5,840,590 A * 11/1998    Myers et al. .................. 438/471

FOREIGN PATENT DOCUMENTS

KR       1020030066957       8/2003

OTHER PUBLICATIONS

Weinstein et al. Hydrogen-decorated lattice defects in proton implanted GaN. applied Physics Letters, vol. 72, # 14, 1998, pp. 1703-1705.*

Jones et al. Amorphization of elemental and compound semiconductors upon ion implantation. J. Mater. Res. vol. 6, # 5, 1991, ppl 1048-1054.*

Shao et al. Using point-defect engineering to increse stability of highly doped ultrashallow junctions formed by molecular-beam-epitaxy growth. Applied Physics Letters. vol. 83, 3 14, 2003, pp. 2823-2825.*

M.G. Weinstein et al. Huydrogen vibrational lines in HVPE GaN. Physica B, 308-310, 2001, pp. 122-125.*

Myers et al. Interactions of defects and H in proton-irradiated GaN(Mg, H), Journal of applied Physics, 97, 2005, pp.*

Nishizawa. Stoichimetry control and point defects in compound semiconductors. Materials Chemistry and Physics 64, 2000, pp. 93-115.*

Zhou et al. Effects of hydrogen doping through ion implantation on the electrical conductivity of ZnO. International Journal of Hydrogen Energy, 29, 2004, pp. 323-327.*

Binari et al. H, He and N implant isolation of n-type GaN. J. Appl. Phys. 78 (5), Sep. 1995, pp. 3008-3011.*

* cited by examiner

[Fig. 1]
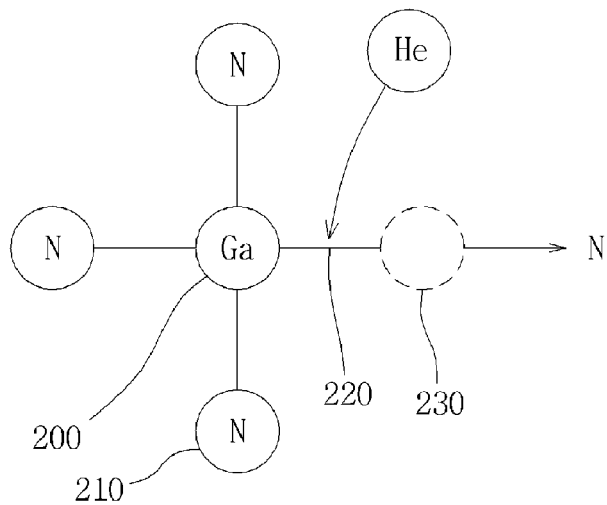
[Fig. 2]
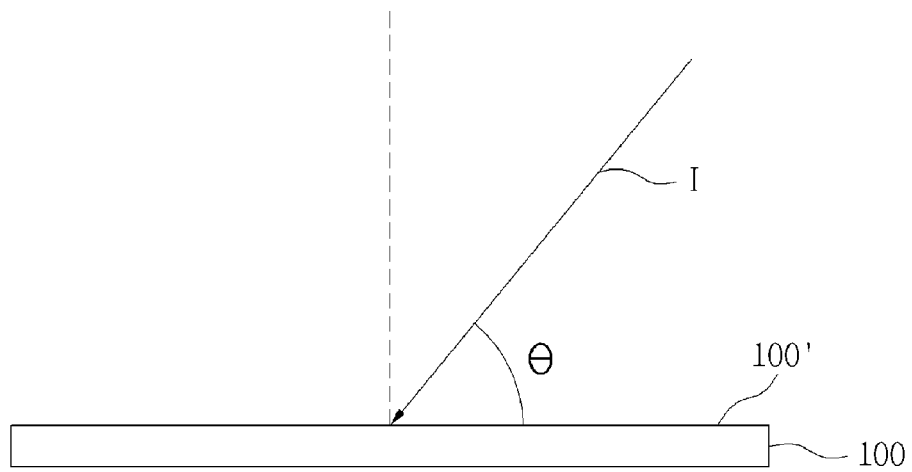
[Fig. 3]
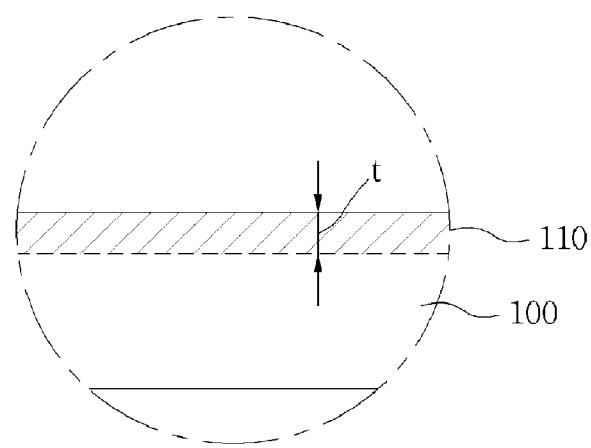

[Fig. 4]
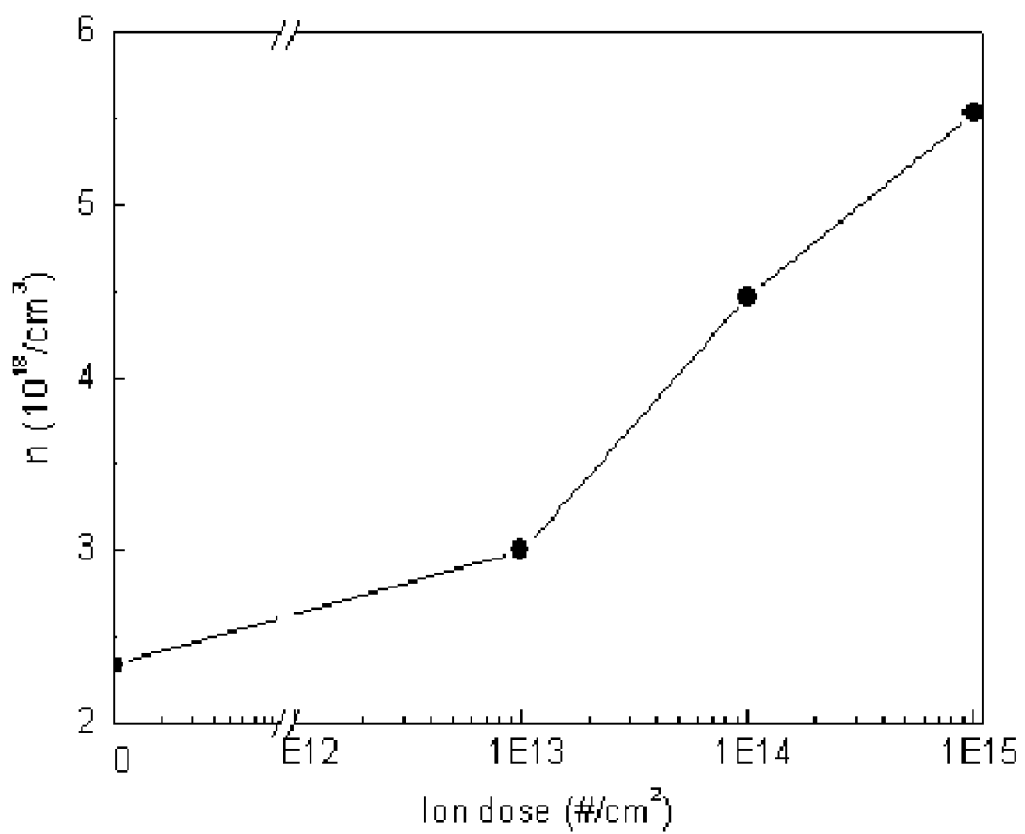

COMPOUND SEMICONDUCTOR SUBSTRATE AND CONTROL FOR ELECTRICAL PROPERTY THEREOF

TECHNICAL FIELD

The present invention relates to a compound semiconductor substrate and a method of controlling electrical properties of the same, in which point defects in an inside of a surface are formed by implanting impurities with high energy, to effectively increase insulating properties or conductive properties.

BACKGROUND ART

As the information and communication technology is rapidly developed, the communication technology for mass signal transmission at high speed is also rapidly developed. Specifically, as the demand of mobile phones, satellite communications, radar devices and the like is progressively expanded in the wireless communication technology, there are increased the requirements for high-speed and high-power electronic devices to be used for the super-high speed information and communication systems of microwave or millimeter broadband.

As an example of a compound semiconductor, since gallium nitride (GaN) has the physical properties, such as high energy band gap, high thermal and chemical stability, high electron saturation velocity and the like, it is applicable to a high-frequency and high-power electron device as well as an optical device. Accordingly, much research of gallium nitride is actively conducted in many fields. A gallium nitride thin film has the various advantages, such as high breakdown field, maximum current density, stable high-temperature operation, high thermal conductivity and the like. In the case of a device (for example, HFET, HEMT and others) using a heterojunction structure of AlGaN/GaN, since the band-discontinuity in an junction interface is great, electrons in high concentration are drifted in the interface, to more increase electron mobility. Further, since the gallium nitride thin film has high velocity of surface acoustic wave (SAW) and excellent temperature stability and produces the effect of polarization of piezoelectric properties, it can be easily manufactured as a band pass filter which is capable of operating at □ or more.

The gallium nitride thin film can be grown on a sapphire substrate by generally using the metal-organic CVD method or the molecular beam epitaxy (MBE) method. Then, since the sapphire substrate and the gallium nitride thin film are greatly different from each other in the respective lattice constant and the coefficient of thermal expansion, it is very difficult to grow a single crystal and many defects occur in growing the thin film. When gallium nitride is grown at high temperature of 800° C. or above, since it naturally has n-type conductive properties by the nitrogen vacancy which is formed due to high volatility of nitrogen and by the influence of the impurity, such as oxygen, it is very difficult to grow a semi-insulating layer thin film. Therefore, when manufacturing the electronic devices, such as HFET and SAW filters, leakage current occurs so that low trans-conductance and insertion lose may be caused.

In conventional technology for manufacturing a semi-insulating thin film substrate, a method of doping the substrate with an n-type dopant and a p-type dopant simultaneously may be used to compensate electrical properties of the substrate. In the method of doping the p-type and n-type dopants simultaneously, excessive counter-doping is performed for the electrical compensation. Then, carrier mobility may deteriorate.

Further, to actually apply a gallium nitride substrate as a light-emitting device, an electronic device or others, a doping process for giving electrical properties is accompanied. The n-type or p-type dopant being implanted onto the gallium nitride substrate provides conductive properties to gallium nitride which is electrically neutral, to enable various optical and electronic operations.

Charge concentration is an important factor to determine the electrical properties of gallium nitride. Since the electrical conductance changes from the insulating properties to the conductive properties according to the charge concentration, the application field of gallium nitride may vary as the properties change. There are two methods of controlling n-type charge concentration within a gallium nitride wafer. One is to control the charge concentration by controlling an amount of a dopant to be actually implanted, and the other is to control the charge concentration by simultaneously implanting the n-type dopant and the p-type dopant so that an electron from the n-type dopant and a hole from the p-type dopant are compensated for each other.

In the former, it is widely used as a method of controlling the charge concentration but it has the drawback that an activation ratio of the dopant decreases as the amount of the dopant increases. In manufacturing the n-type gallium nitride substrate of high concentration, when an excessive amount of the dopant is implanted to overcome the low activation ratio, crystalline properties deteriorate and cracks may be caused. In the latter, it has the drawback that the charge concentration rapidly decreases, and it needs to perform the dual process which simultaneously satisfy the process conditions of implanting the n-type dopant and of implanting the p-type dopant.

In growing gallium nitride bulk, the extent of activation of the dopant to act as a charge within the wafer and the extent of efficient control of the activation ratio are very important in determining the electrical properties of gallium nitride. However, any effective plans for controlling the charge concentration by controlling the activation ratio of the charge have not yet been proposed. Therefore, it needs a method of effectively controlling electrical properties, which can be broadly applied to a compound semiconductor, such as gallium nitride.

DISCLOSURE OF INVENTION

Technical Problem

Therefore, the present invention is directed to provide a compound semiconductor in which electrical properties are controlled.

Another object of the present invention is to provide a method of controlling electrical properties of a compound semiconductor, which increases insulating properties or improves conductive properties in a simple manner.

Technical Solution

In accordance with an aspect of the present invention, the present invention provides a compound semiconductor substrate, wherein an electrically-neutral impurity with energy of 0.1 to 10 MeV is implanted onto a surface of the compound semiconductor substrate so that a point defect is formed in an inside structure and electrical properties of the substrate are changed.

The compound semiconductor substrate may be an undoped wafer, wherein electrical resistance of the substrate increases so that insulating properties increase. Further, the compound semiconductor substrate may be doped with an n-type dopant, wherein the impurity is implanted to increase charge concentration of the substrate so that conductive properties increase.

In accordance with another aspect of the present invention, the present invention provides a method of controlling electrical properties of a compound semiconductor substrate, wherein the electrical properties of the substrate are changed by forming a point defect in an inside structure of the substrate by implanting an impurity being electrically neutral with energy of 0.1 to 10 MeV in a surface of the substrate.

Advantageous Effects

In accordance with the present invention, the electrical properties of a compound semiconductor can be effectively controlled during or after growing of the compound semiconductor. Specifically, there is provided the compound semiconductor with the electrical properties controlled from high insulating properties to high conductive properties through a simple process. Accordingly, the reliability of the products, such as various devices using the compound semiconductor, is improved and the application range of the compound semiconductor is increased.

BRIEF DESCRIPTION OF THE DRAWINGS

The above and other features and advantages of the present invention will become more apparent to those of ordinary skill in the art by describing in detail preferred embodiments thereof with reference to the attached drawings in which:

FIG. 1 is a diagram illustrating nitrogen vacancy formed inside gallium nitride by impurity implantation;

FIG. 2 is a diagram illustrating a method of implanting the impurity in a gallium nitride substrate;

FIG. 3 is a sectional view of a reforming layer formed on a surface of the gallium nitride substrate; and FIG. 4 is a graph illustrating a change in charge concentration inside gallium nitride according to the impurity implantation.

MODE FOR THE INVENTION

The present invention will now be described more fully hereinafter with reference to the accompanying drawings, in which preferred embodiments of the invention are shown.

The present invention controls electrical properties of a compound semiconductor, such as gallium nitride, thereby increasing insulating properties of a wafer which is electrically neutral or more increasing charge concentration of an n-type wafer which is electrically conductive.

The aforementioned control of the electrical properties is performed differently from the conventional implantation of a dopant. Specifically, when a light-weight impurity is implanted around a surface with high energy, a point defect is generated inside a wafer or a substrate. The point defect is not removed by heat treatment subsequently performed. Thus, the point defect effectively controls the insulating properties or conductive properties of the compound semiconductor, so that an application field thereof is expanded and the reliability of a product is increased.

Generally, the impurity uses a different material from a material functioning as a donor or an acceptor to give electrical properties to the semiconductor wafer or substrate. That is, being electrically neutral and not acting as the donor or acceptor inside the wafer or substrate, the impurity generates the point defect corresponding to a donor level inside the compound semiconductor, by using a more light-weight element than the material forming the compound semiconductor, so that electrical resistance of the compound semiconductor is increased or charge concentration is increased by increasing an activation ratio of an n-type dopant.

In the present invention, the compound semiconductor substrate is defined as including not only a freestanding layer but also a composite substrate comprising a base substrate for growing a compound semiconductor and a compound semiconductor thin film or thick film formed on the base substrate.

Below, the present invention will be described with respect to gallium nitride as an example of a compound semiconductor. However, the present invention is not limited thereto. The present invention can be effectively applied to various compound semiconductors and a diamond substrate, which will be described later.

Description will be presented regarding control of electrical properties of an n-type gallium nitride substrate. When a dopant is implanted to gallium nitride to control charge concentration, it is most important how much electrons the dopant generates and how much the electrons contribute to actual electrical conductivity. That is, it means an activation ratio of the dopant. When the activation ratio is controlled, the charge concentration can be effectively controlled and further the electrical properties, such as conductive properties, semi-conductive properties, insulating properties and the like, can be effectively tuned, so that the application field thereof can be expanded when the gallium nitride substrate is manufactured as a device.

To improve the characteristics of LED, LD and various consumer devices, doping in high charge concentration is needed if possible. To increase n-type charge concentration, there is a method of increasing an implantation amount of the n-type dopant of silicon (Si) and the like or increasing the activation ratio of the dopant as implanted.

Unlike the aforementioned method, the present invention provides a method of controlling the point defect by changing an inside structure of the gallium nitride semiconductor, to propose a method of controlling the electrical properties of gallium nitride by forming a nitrogen vacancy $V_N$ forming a donor level. In the case of the nitrogen vacancy $V_N$, the donor level is formed in the compound semiconductor, to increase the charge concentration of the n-type dopant and to compensate a gallium vacancy $V_G$ which is the impurity of an acceptor level being inherently included in the n-type gallium nitride substrate. Therefore, a crack can be prevented from occurring which is necessarily accompanied when the gallium nitride substrate is grown due to the gallium vacancy and the structural defect since an amount of the implanted dopant is excessively increased.

When a light-weight impurity is implanted inside gallium nitride with high energy so that the nitrogen vacancy is formed, these form the donor level to bring forth the effect of increasing the charge concentration of gallium nitride. The nitrogen vacancy can be generated by annealing gallium nitride. However, in this case, an amount of the generated nitrogen vacancy is very small and a gallium droplet is formed to expedite the forming of the gallium vacancy. Further, in the case of a method of growing gallium nitride by lowering a ratio of N source/Ga source, there is the possibility of forming the nitrogen vacancy but the influence on the charge concentration is very low because the concentration of the nitrogen vacancy being actually generated is very low.

The present invention increases the charge concentration by increasing the nitrogen vacancy by the impurity implanted from the outside during or after the growing of gallium nitride. Specifically, in the present invention, the nitrogen vacancy is formed by allowing helium (He) and the like, which is the light element, to collide against the surface of gallium nitride by the method of implantation and the like.

The quantum electron configuration of He is 1s2. Therefore, He does not act as the donor or acceptor for generating electrons inside the gallium nitride substrate and stably exists inside gallium nitride. As illustrated in FIG. 1, He which is implanted inside gallium nitride cuts a bond 220 of gallium 200 and nitride 210, to form a nitrogen vacancy 230 which is a point defect. The nitrogen vacancy acts as a donor, to increase the charge concentration. An increase of the nitrogen vacancy which electrically exists in the donor level electrically compensates the gallium vacancy which is relatively positioned in the acceptor level, thereby additionally generating an effect of removing a defect to interrupt the activation of the n-type dopant. Therefore, the activation ratio of the n-type dopant implanted inside gallium nitride is increased.

To increase the charge concentration inside gallium nitride, the present invention reforms the inside structure of gallium nitride by the light element, such as He and the like, and allows He having high energy (for example, about 2 MeV) to be implanted on the surface of a gallium nitride 100 at room temperature under high vacuum, as illustrated in FIG. 2.

As illustrated in FIG. 2, an impurity I is injected on a gallium nitride surface 100 in the oblique direction from the perpendicular direction to the gallium nitride surface 100'. By this method, scattering or channeling occurring when the impurity is injected along the perpendicular direction to the surface can be prevented, and an injection depth of the impurity can be effectively controlled. An incidence angle $\theta$ is defined as an angle between the gallium nitride surface 100 and the direction to which the impurity is implanted. The incidence angle $\theta$ may be determined within the range of 2 to 88°.

In the present invention, the impurity as an element to be implanted in the compound semiconductor may use H, He, B and the like which are capable of reforming a micro structure of the compound semiconductor, which are lightweight to minimize destruction of the bonding between elements forming the compound semiconductor, and which maintain as being electrically neutral. A mixture of these may be implanted. Preferably, the impurity being injected may use a material having the high energy being within the range of 0.1 to 10 MeV for forming the point defect.

Preferably, the impurity may be implanted onto the substrate at room temperature. The inside structure of gallium nitride may be improved by further including a step of heat treatment after the impurity is implanted onto the gallium nitride substrate.

Gallium nitride in which the impurity is implanted may be doped with the n-type dopant before the impurity is implanted or may be doped with the n-type dopant at the same time when the impurity is implanted. Doping concentration of the n-type dopant may be within the range of $10^{16}$/□ to $10^{21}$/□. In the present invention, it has been confirmed that the charge concentration can be increased by gallium nitride doped with the n-type dopant in the high concentration of $10^{17}$/□ or more. Further, the n-type dopant to be doped on the compound semiconductor substrate, such as the gallium nitride substrate, may use at least any one or more selected from Si, Ge, S, Se, Te and O.

The charge concentration can be controllable according to the amount of the impurity being implanted. Considering an effective charge movement distance of the dopant being input, the impurity in an amount which is greater than density of a surface defect of the compound semiconductor, such as gallium nitride, may be implanted, and specifically, the impurity may be implanted within the range of $10^5$/□ to $10^{17}$/□.

The distance of implantation of the impurity on the surface of the compound semiconductor, such as gallium nitride, may vary according to the energy of the impurity as being implanted. In the present invention, as illustrated in FIG. 3, a thickness of a surface reforming layer 110 by the implantation of the impurity, that is, the distance t of implantation of the impurity, is within the range of 20□ from the surface of the substrate 100.

As described above, the electrical properties can be effectively controlled by implanting the impurity just nearby the surface of the compound semiconductor. Further, the impurity may be locally implanted on the surface of the substrate as well as the whole surface, to locally control the electrical properties of the compound semiconductor.

To confirm a change in the charge concentration according to the amount of the impurity being implanted, He of 2 MeV is allowed to be implanted on the surface of gallium nitride at the oblique direction by 5° from the surface thereof. The respective first charge concentration of gallium nitride samples being used are $1.79 \times 10^{17}$/□ and $2.33 \times 10^{18}$/□. As shown in Table 1, as the amount of the impurity being implanted is increased, the charge concentration is increased by two times or more.

TABLE 1

|  | Amount of impurity being implanted (/□) | Charge concentration ($\times 10^{18}$/□) |
| --- | --- | --- |
| Sample 1 | 0 | 2.33 |
|  | $1 \times 10^{13}$ | 2.9 |
|  | $1 \times 10^{14}$ | 4.47 |
|  | $1 \times 10^{15}$ | 5.53 |
| Sample 2 | 0 | 0.179 |
|  | $1 \times 10^{13}$ | 0.357 |
|  | $1 \times 10^{14}$ | 0.376 |

FIG. 4 is a graph illustrating the change in the charge concentration according to the amount of impurity being implanted in sample 1. It is noted that the charge concentration rapidly increases in proportion to the amount of the impurity being implanted.

As described above, the present invention increases the charge concentration by forming the nitrogen vacancy by He being implanted on grown gallium nitride and removing the inside defect obstructing the activation ratio of the dopant, not by doping the substrate with dopant during the growing of gallium nitride. Accordingly, the charge concentration can be accurately controlled and the crack can be prevented from occurring on the gallium nitride substrate upon the doping in high concentration. Furthermore, the region and depth of implantation of the impurity can be controlled by controlling an incidence angle and an incidence area of the impurity being implanted, such as He and the like, to realize an improved device.

Further, the compound semiconductor to be controlled with respect to the electrical properties in the present invention includes not only gallium nitride but also various materials which have the crystal, optical and structural similarity to gallium nitride and, specifically, AlN, InN, $Al_xGa_yIn_zN$ (x+y+z=1), BN, SiC, ZnO, MgO, CdO, $Zn_xMg_yCd_zO$(x+y+z=1), GaAs, InAs, ZnS, MgS, ZnSe, ZnTe, CdS, CdSe, CdTe, and the like. Further, the present invention can be effectively applied to a diamond substrate, to control the electrical properties thereof.

The present invention can be effectively applied not only to a doped compound semiconductor but also to a compound semiconductor which is in an undoped neutral state, to increase the insulating properties. For example, when a light-weight element is implanted to undoped gallium nitride (pure GaN) having insulating properties, the insulating properties more increase by an increase in the structural defect, contrary to the case of applying the present invention to the n-type gallium nitride.

According to an embodiment of the present invention, the high resistance of about $10^5$ Ω-cm can be maintained by increasing the electrical resistance by implanting He onto the surface of the gallium nitride substrate. The impurity is implanted with the energy of about 2 MeV or more so that the reforming layer of about 1☐ or more is formed on the surface of the gallium nitride substrate. Further, it has been confirmed that the thickness of the reforming layer can be controlled according to the strength of the energy of the impurity.

Further, after the impurity is implanted, the gallium nitride substrate can be annealed at temperature of 500 to 1000° C. Then, the reforming layer on the surface thereof is not almost damaged by the annealing.

By using the above-described new method of controlling the electrical properties of the compound semiconductor, the electrical properties of diverse light-emitting devices, detecting devices, switching devices and the like using the compound semiconductor can be variously changed.

The invention has been described using preferred exemplary embodiments. However, it is to be understood that the scope of the invention is not limited to the disclosed embodiments. On the contrary, the scope of the invention is intended to include various modifications and alternative arrangements within the capabilities of persons skilled in the art using presently known or future technologies and equivalents. The scope of the claims, therefore, should be accorded the broadest interpretation so as to encompass all such modifications and similar arrangements.

The invention claimed is:

1. A compound semiconductor substrate, comprising:
    a plurality of nitrogen vacancies caused by a non-dopant impurity that was implanted at an energy of 0.1 to 10 MeV into a surface of the compound semiconductor substrate and that causes the compound semiconductor substrate to have a higher conductivity than before the implantation of the non-dopant impurity,
    wherein the compound semiconductor substrate is selected from the group consisting of GaN, AlN, InN, $Al_xGa_yIn_zN$ (x+y+z=1), and BN,
    the compound semiconductor substrate is an n-type compound semiconductor substrate, and
    the non-dopant impurity implanted onto the compound semiconductor substrate is $He^+$.

2. The compound semiconductor substrate of claim 1, wherein the compound semiconductor substrate has an higher charge concentration than before the implantation of the non-dopant impurity.

3. The compound semiconductor substrate of claim 1, wherein a concentration of n-type dopant in the n-type compound semiconductor substrate is within a range of $10^{16}/cm^3$ to $10^{21}/cm^3$.

4. The compound semiconductor substrate of claim 1, wherein an n-type dopant in the compound semiconductor substrate is selected from the group consisting of Si, Ge, S, Se, Te and O.

5. The compound semiconductor substrate of claim 1, wherein a dose of the non-dopant impurity implanted into the compound semiconductor substrate is $10^5/cm^2$ to $10^{17}/cm^2$.

6. The compound semiconductor substrate of claim 1, wherein the non-dopant impurity implanted onto the compound semiconductor substrate reforms a portion of the compound semiconductor substrate that is within 20 μm from the surface.

7. A method of controlling electrical properties of a compound semiconductor substrate, the method comprising:
    forming a plurality of nitrogen vacancies within the compound semiconductor substrate by implanting a non-dopant impurity into a surface of the compound semiconductor substrate at an energy of 0.1 to 10 MeV to increase conductivity of the compound semiconductor substrate,
    wherein the compound semiconductor substrate is selected from the group consisting of GaN, AlN, InN, $Al_xGa_yIn_zN$ (x+y+z=1), and BN,
    the compound semiconductor substrate is an n-type compound semiconductor substrate, and
    the non-dopant impurity implanted onto the compound semiconductor substrate is $He^+$.

8. The method of claim 7, wherein the non-dopant impurity is implanted at an oblique angle within a range of 2° to 88° with respect to the surface of the compound semiconductor substrate.

9. The method of claim 7, wherein the non-dopant impurity is implanted into the compound semiconductor substrate at room temperature.

10. The method of claim 7, further comprising:
    annealing the compound semiconductor substrate after the non-dopant impurity is implanted into the compound semiconductor substrate.

11. The method of claim 7, wherein a concentration of n-type dopant in the compound semiconductor substrate is within a range of $10^{16}/cm^3$ to $10^{21}/cm^3$.

12. The method of claim 7, wherein an n-type dopant present in the compound semiconductor substrate is selected from the group consisting of Si, Ge, S, Se, Te and O.

13. The method of claim 7, wherein the non-dopant impurity is implanted into the compound semiconductor substrate at a dose within a range of $10^5/cm^2$ to $10^{17}/cm^2$.

14. The method of claim 7, wherein the non-dopant impurity is implanted into the compound semiconductor substrate at a depth of at most 20 μm from the surface.

* * * * *